United States Patent
England et al.

(10) Patent No.: US 9,553,080 B1
(45) Date of Patent: Jan. 24, 2017

(54) METHOD AND PROCESS FOR INTEGRATION OF TSV-MIDDLE IN 3D IC STACKS

(71) Applicant: GLOBALFOUNDRIES Inc., Grand Cayman (KY)

(72) Inventors: Luke England, Saratoga Springs, NY (US); Ramakanth Alapati, Dublin, CA (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/858,373

(22) Filed: Sep. 18, 2015

(51) Int. Cl.
*H01L 21/00* (2006.01)
*H01L 25/00* (2006.01)
*H01L 25/065* (2006.01)

(52) U.S. Cl.
CPC .......... *H01L 25/50* (2013.01); *H01L 25/0657* (2013.01); *H01L 2225/06544* (2013.01); *H01L 2225/06562* (2013.01); *H01L 2225/06572* (2013.01); *H01L 2225/06586* (2013.01)

(58) Field of Classification Search
CPC ............... H01L 25/50; H01L 25/0657; H01L 2225/06544
See application file for complete search history.

(56) References Cited

U.S. PATENT DOCUMENTS

| | | | | |
|---|---|---|---|---|
| 7,829,464 B2* | 11/2010 | Matsumoto | ............... | C09G 1/02 438/690 |
| 2012/0267788 A1* | 10/2012 | Hong | ................ | H01L 21/76898 257/774 |
| 2013/0119543 A1* | 5/2013 | Yu | ..................... | H01L 21/76898 257/741 |
| 2013/0187280 A1* | 7/2013 | Yuan | ..................... | H01L 23/481 257/773 |
| 2014/0264235 A1* | 9/2014 | Gong | ................... | H01L 23/5386 257/4 |
| 2015/0200242 A1* | 7/2015 | England | ................... | H01L 28/60 257/532 |
| 2015/0228555 A1* | 8/2015 | Rabie | .................... | H01L 23/481 257/774 |
| 2016/0075884 A1* | 3/2016 | Chen | ........................ | C09D 5/00 521/153 |
| 2016/0225679 A1* | 8/2016 | Kannan | ................... | H01L 22/14 |

* cited by examiner

*Primary Examiner* — Laura Menz
(74) *Attorney, Agent, or Firm* — Ditthavong & Steiner, P.C.

(57) ABSTRACT

Methods for integrating MOL TSVs in 3D SoC devices including face-to-face bonded IC chips. Embodiments include providing a device layer in each of IC chips on upper surfaces of top and bottom silicon wafers; forming, subsequent to the device layer, through-silicon vias (TSVs) extending through an upper surface of the device layer in each of the IC chips and into the bottom Si wafer; forming, subsequent to the TSVs, a dielectric layer on the upper surface of the device layer in each of the IC chips of the top and bottom Si wafers; forming a back-end-of-line metal layer in the dielectric layer of each of the IC chips of the top and bottom Si wafers; face-to-face bonding of opposing IC chips of the top and bottom Si wafers; and dicing adjacent bonded IC chips through vertically aligned dicing lanes in the top and bottom Si wafers.

9 Claims, 7 Drawing Sheets

FIG. 1
Background

METHOD AND PROCESS FOR INTEGRATION OF TSV-MIDDLE IN 3D IC STACKS

TECHNICAL FIELD

The present disclosure relates generally to designing and fabricating integrated circuit (IC) devices. The present disclosure is particularly applicable to integrating through-silicon vias (TSVs) in IC areas/chips of a semiconductor/silicon (Si) wafer that is to be bonded with another semiconductor/Si wafer.

BACKGROUND

Generally, a plurality of devices/components (e.g., transistors, diodes, etc.) may be designed and embedded into an IC chip/die, which then may be placed into a package (e.g., plastic casing) or used as a bare die for placement onto a printed circuit board (PCB) of an electronic device. In addition to traditional technology node scaling at the transistor level, three-dimensional (3D) IC chip stacking is increasingly being utilized to continue the use of current semiconductor manufacturing technologies (e.g., 28 nm, 22 nm, etc.) to create 3D system-on-chip (SoC) devices and provide solutions for meeting performance, power, and bandwidth requirements of various electronic devices. A 3D SoC device may include several logic, memory, analog, or other chips of different technology nodes that may be connected to each other by using TSV architecture. Typically, TSVs are vertical vias etched into a silicon layer and filled with a conductive material (e.g., copper (Cu)), to provide connectivity for transferring electronic signals or power supplies between the vertically stacked IC chips or between an IC chip and an IC package substrate.

Figure 1:
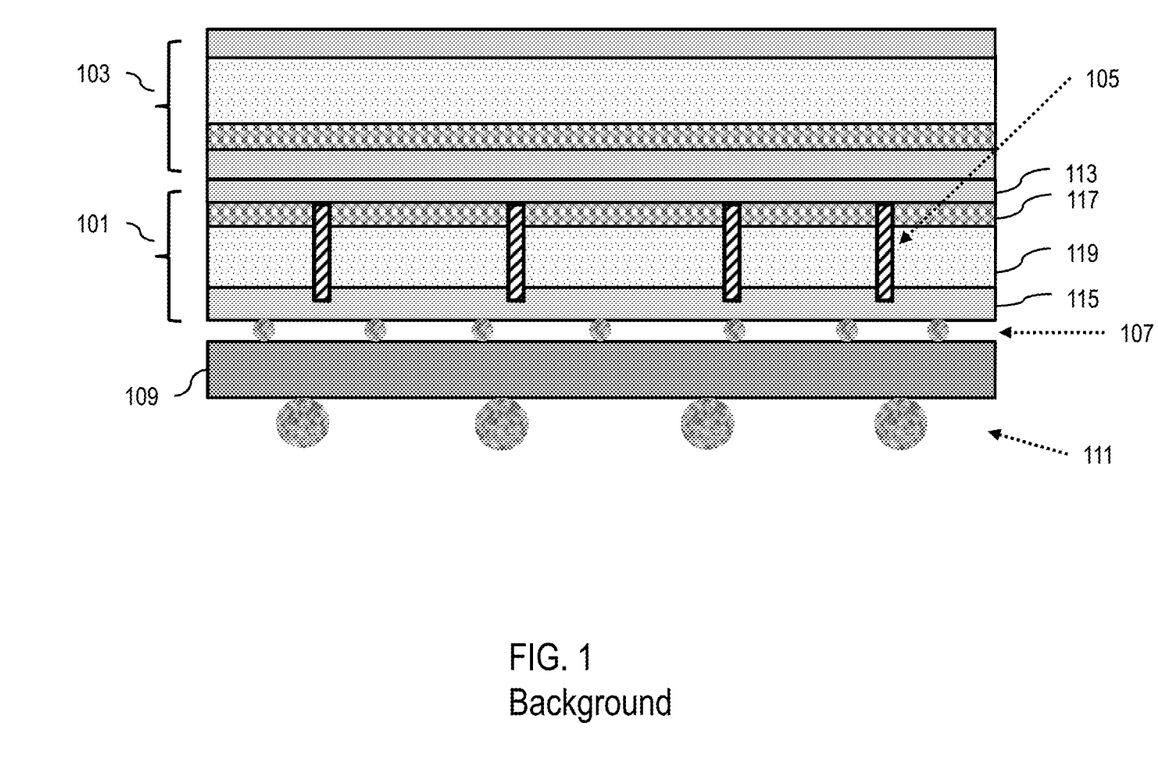
FIG. 1 schematically illustrates an example of an IC chip stack structure including face-to-face bonding of IC chips.

FIG. 1 schematically illustrates an example IC chip stack structure including a face-to-face (F2F) bonding of IC chips. As illustrated, the 3D IC chip stack includes IC chips 101 and 103 with TSVs 105 used to interconnect the 3D stack (e.g., IC chip 101), through an interconnection layer 107 (e.g., including solder balls, copper pillars, micro-bumps) to an IC package substrate 109. The IC package substrate 109 may include an interconnection layer 111 (e.g., including a solder ball grid array) for connecting to another substrate or a printed circuit board of an electronic device. As illustrated, the IC chips may include back-end-of-line (BEOL) metal layers including front metal layers 113 and a back metal layer 115, a device layer 117, and a silicon layer/IC substrate 119. Also, the device layer 117 may include one or more dielectric layers for providing isolation between the devices. The F2F bonding of the IC chips 101 and 103 may be through metal vias connected to a final metal layer included in the front metal layers 113.

In a 3D SoC device, individual SoC functional blocks may be partitioned onto individual IC chips for connection during 3D IC packaging, where shorter wire lengths in the 3D configuration allow for performance gains and a decrease in overall power consumption of the device. Also, reduction in wire lengths reduces total number of BEOL metal layers needed. In a homogeneous application of a 3D SoC device, functional blocks within a single technology node are partitioned resulting in a smaller die/chip size on Si wafers for increased yield and device-per-wafer efficiency. Such an application may allow for extension of existing technology for further manufacturing on currently available/purchased manufacturing toolsets resulting in extension of 14 nm technology node and delaying a need for a reduction (e.g., 10 nm scaling) in the technology node. In a heterogeneous application of a 3D SoC device, the block partitioning may be targeted based on scalability, wherein higher scalable digital cores and IP are scaled to advanced technology nodes. Devices that may not scale well, such as SRAM, I/O's, and other analog devices may be manufactured on older technology. Such an application may result in higher overall yield and reduced cost due to the possibility of using older technology for part of the system.

As noted, a 3D SoC device/IC chip stack may be formed by F2F bonding of vertically aligned semiconductor wafers that include an array of IC chips on each wafer, where bonded 3D IC chips may be separated from each other through dicing lanes between adjacent bonded 3D IC chips. A current industry approach for 3D SoC devices includes wafer bonding in a F2F configuration, where TSVs are etched into one of the wafers (e.g., bottom wafer) after the bonding is completed (TSV-last approach). However, a TSV-last approach requires sophisticated alignment, design and process techniques. Also, the TSV structures and quality in a 3D SoC device using a TSV-last approach may be negatively impacted as etching of a TSV from the backside of an IC substrate may be difficult, e.g., causing a "blowout" when reaching the TSV contact point.

A need therefore exists for a methodology enabling integration of TSVs in a 3D SoC device prior to BEOL processes.

SUMMARY

An aspect of the present disclosure is a method and process for integrating middle-of-line (MOL) TSVs in 3D SoC devices including face-to-face bonded IC chips.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing a device layer in each of IC chips on upper surfaces of top and bottom Si wafers; forming, subsequent to the device layer, TSVs extending through an upper surface of the device layer in each of the IC chips and into the bottom Si wafer; forming, subsequent to the TSVs, a dielectric layer on the upper surface of the device layer in each of the IC chips of the top and bottom Si wafers; forming a BEOL metal layer in the dielectric layer of each of the IC chips of the top and bottom Si wafers; face-to-face bonding of opposing IC chips of the top and bottom Si wafers; and dicing adjacent bonded IC chips through vertically aligned dicing lanes in the top and bottom Si wafers.

In one aspect, forming a TSV includes forming a cavity extending through the upper surface of the device layer in each of the IC chips and into the bottom Si wafer; forming a TSV dielectric layer on vertical and horizontal surfaces of the cavity; and depositing in the cavity a conductive material surrounded by the TSV dielectric layer, wherein an upper surface of the TSV is exposed.

A further aspect includes forming conductive elements between the BEOL metal layer and the device layer in each of the IC chips of the top and bottom Si wafers.

Another aspect includes planarizing upper surface of the dielectric layer to a level of a BEOL final metal layer in each of the IC chips of the top and bottom Si wafers; and forming vias in the dielectric layer of each of the IC chips of the top and bottom Si wafers, wherein upper surfaces of the vias are coplanar with the BEOL final metal layer in each of the IC chips of the top and bottom Si wafers.

In another aspect, the upper surfaces of the vias in the IC chips of the bottom Si wafer are either larger or smaller than the upper surfaces of the vias in the IC chips of the top Si wafer.

In another aspect, forming the BEOL metal layer and the vias in each of the IC chips of the top and bottom Si wafers is by a dual damascene process.

In another aspect, prior to the dicing, the method includes removing, in each of the IC chips, a vertical portion of the bottom Si wafer to expose a section of each of the TSVs; and forming conductive elements between an exposed section of each of the TSVs and interconnecting elements of an IC package substrate.

In some aspects, for the face-to-face bonding of the opposing IC chips, the method includes hybrid-oxide bonding of vertically aligned exposed upper surfaces of the vias in the opposing IC chips. In one aspect, the hybrid-oxide bonding is at a low-k dielectric layer in the opposing IC chips.

Some aspects include forming the TSVs after forming contacts for the device layer and before forming first via contacts to BEOL metal layer in the IC chips of the bottom Si wafer. In a further aspect, sizes of the TSVs are based on an aspect ratio of 1 to 20.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of requiring sophisticated alignment, design and process techniques attendant upon etching TSVs for 3D IC chip stacks/3D SoC devices subsequent to wafer bonding. The present disclosure addresses and solves such problems, for instance, by, inter alia, integrating TSVs in an IC chip during MOL processes, subsequent to forming a device layer in the IC chip. Also, the TSV structures and quality in a 3D SoC device using a TSV-middle approach may be superior to a TSV-last approach, where etching of a TSV-last from a backside of a Si wafer may be difficult.

Manufacturing of IC devices may include front-end-of-line (FEOL), MOL and BEOL processes, whereby various elements/components of an IC device may be created/integrated. The FEOL processes may include wafer preparation, isolation, well formation, gate patterning, spacer, extension and source/drain implantation, or other like processes. The MOL processes may include formation of a gate contact. The BEOL processes may include a series of wafer processing steps for interconnecting the elements created during the FEOL and MOL processes. As noted, in creating 3D SoC devices, TSV structures may be integrated into an IC substrate that may connect to an IC package or another substrate (e.g., a PCB).

Figure 2A:
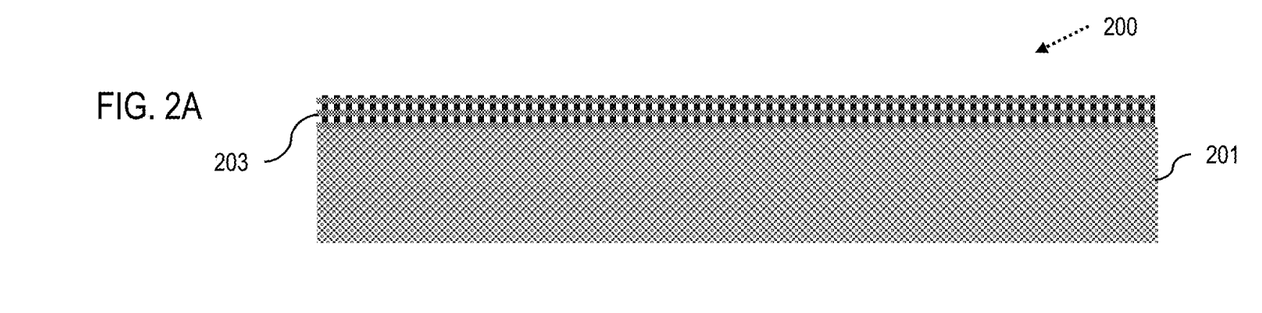
FIGS. 2A through 2C schematically illustrate a process flow for preparing IC chips for integration of MOL TSV structures, in accordance with exemplary embodiments.
Figure 2B:
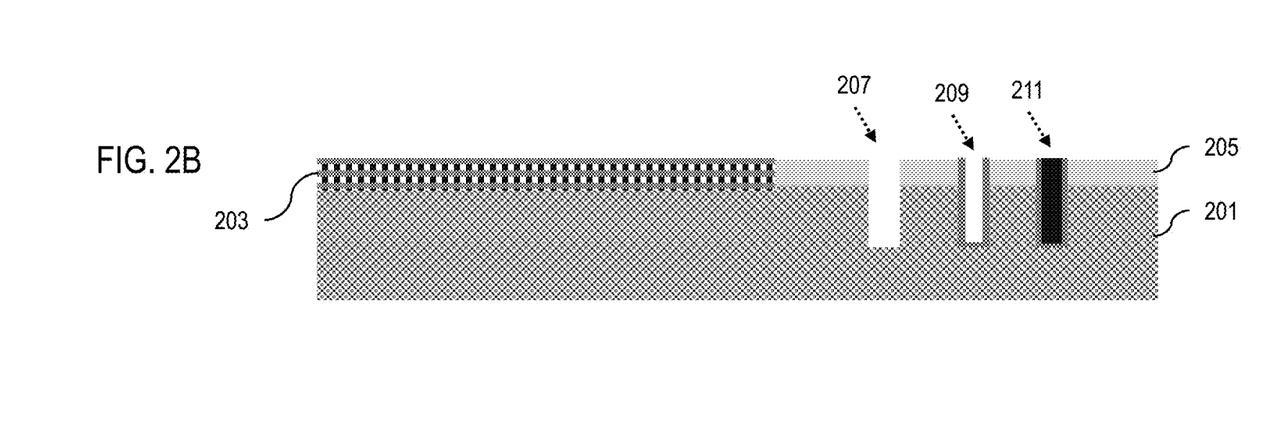

FIG. 2A illustrates an IC chip 200 including IC substrate/silicon wafer 201 and a device layer 203 that may include circuits/elements/components created by FEOL processes. As illustrated in FIG. 2B, the device layer 203 may include an area 205 where TSV structures may be implemented. The TSVs may be formed, subsequent to the formation of the FEOL device layer 203, by use of MOL semiconductor manufacturing processes, which may include etching cavities 207 through a section (e.g., area 205) of the device layer 203, depositing a conformal layer of isolation material (e.g., silicon oxide, silicon nitride, etc.) in the cavities 207 to form isolated cavities 209, and filling the isolated cavities 209 with conductive material such as copper, tungsten, etc. to form the TSV structures 211. Adverting to FIG. 2C, BEOL processes may be utilized to form an interconnect layer 213 for connecting the IC chip 200 to another chip/device, where the interconnect layer 213 may include one or more dielectric layers 215 (e.g., of low-k and/or standard dielectric materials) and BEOL metal layers 217 including a final metal layer and conductive elements connected to the FEOL device layer 203 and the TSVs 211. The TSVs may be formed after forming contacts for the FEOL device layer 203 and before forming first via (e.g., V0) contacts to BEOL metal layers 217 in the IC chips of the bottom Si wafer. In some instances, the TSVs 211 may be at a size of 2×20 µm or at a standard size of 6×55 µm, wherein the size may depend on pitch of the interconnecting elements. Also, the size of the TSVs may be based on an aspect ratio of 1 to 20 and be determined by the end application need.

Figure 2C:
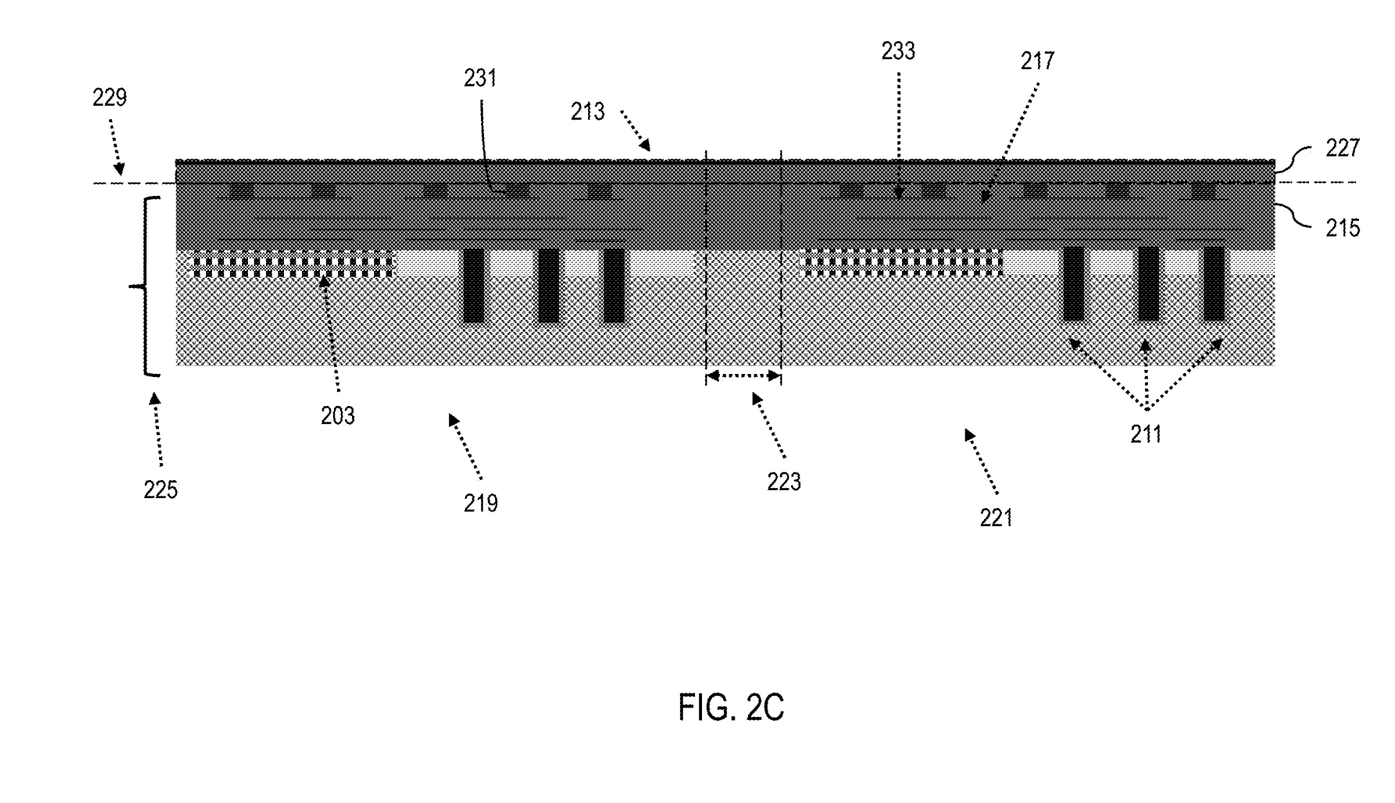

Moreover, FIG. 2C illustrates two adjacent IC chips 219 and 221 as well as a dicing lane 223 in between the two IC chips of a bottom Si wafer 225. A portion 227 of an upper surface of the dielectric layers 215 may be removed (e.g., by a chemical-mechanical-polishing (CMP) process) to planarize the dielectric layers to a level of an upper surface 229 of a final metal layer in the BEOL metal layers 217. Additionally, metal (e.g., Cu) vias 231 are formed in the dielectric material 215 and make contact with the IC connection elements 233 of the BEOL metal layers 217, wherein upper surfaces of the vias 231 are coplanar with the dielectric as illustrated by the level of the upper surface 229. The final BEOL layers 217 and the vias 231, including the upper surface 229, may be formed by a dual damascene process.

Figure 2D:
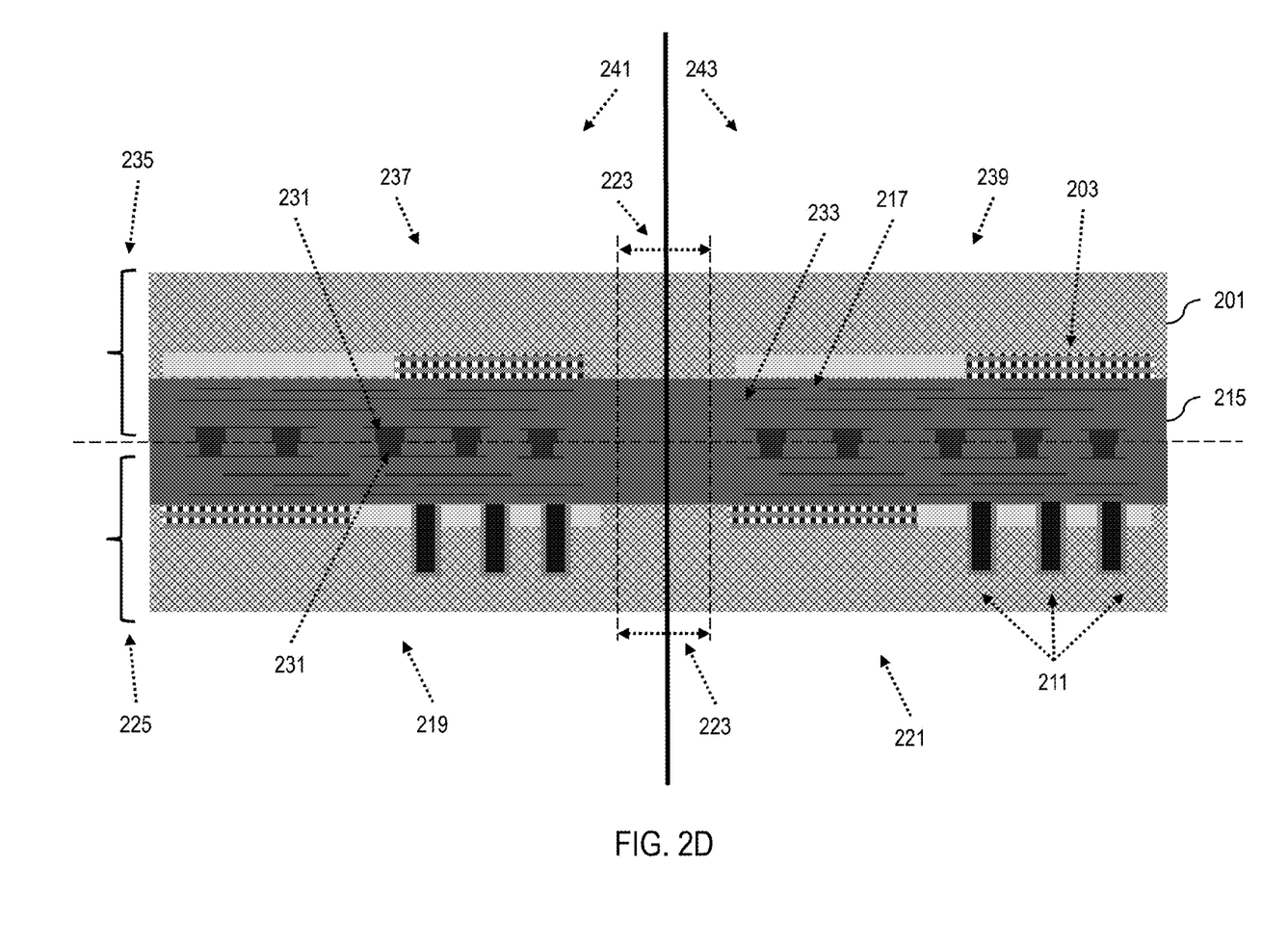
FIGS. 2D through 2F schematically illustrate a process flow for forming and dicing IC chip stacks including MOL TSV structures, in accordance with exemplary embodiments.

Adverting to FIG. 2D, some of the processes discussed with reference to FIGS. 2A through 2D may be used to provide a top wafer 235 that may be utilized in forming bonded IC chips in 3D SoC devices. As in the bottom wafer 225, the top wafer 235 includes two IC chips 237 and 239 each including an IC substrate/Si wafer 201, a device layer 203, dielectric layers 215, BEOL metal layers 217 including IC connection elements 233, and vias 231. However, the IC chips 237 and 239 do not include TSVs 211. A F2F bonding of the top 235 and bottom 225 wafers is formed, wherein dicing lanes 223 are vertically aligned and opposing IC chips 219/237 are bonded to form a 3D SoC device 241 and opposing IC chips 221/239 are bonded to form a 3D SoC device 243. Also, exposed upper surfaces of vertically aligned vias 231 in the top and bottom wafers may be bonded to each other. A hybrid-oxide bonding process may, for example, be utilized for the bonding of the vias in the opposing IC chips. A hybrid-oxide bonding process includes wafer bonding of planarized dielectric and copper surfaces. An initial bonding may be completed by pre-treating the dielectric surfaces of two wafers with a plasma or wet clean and then bringing the wafers into contact to allow the dangling bonds to attract to one another. These process steps may be done at room temperature or an elevated temperature. A subsequent thermal anneal may be completed to strengthen the dielectric bond and to drive diffusion between two opposing copper contacts forming a single interconnect structure. Additionally, the hybrid-oxide bonding may be at a low-k dielectric layer in the BEOL dielectric layers 215 in the opposing IC chips. In addition, the upper surfaces of the vias 231 of the bottom wafer 225 (e.g., in the IC chips 219 and 221) may be larger or smaller than the upper surfaces of the vias 231 of the top wafer 235 (e.g., in the IC chips 237 and 239). A final thermal anneal may be performed to cause a Cu—Cu pad connection to diffuse into a single Cu structure.

Figure 2E:
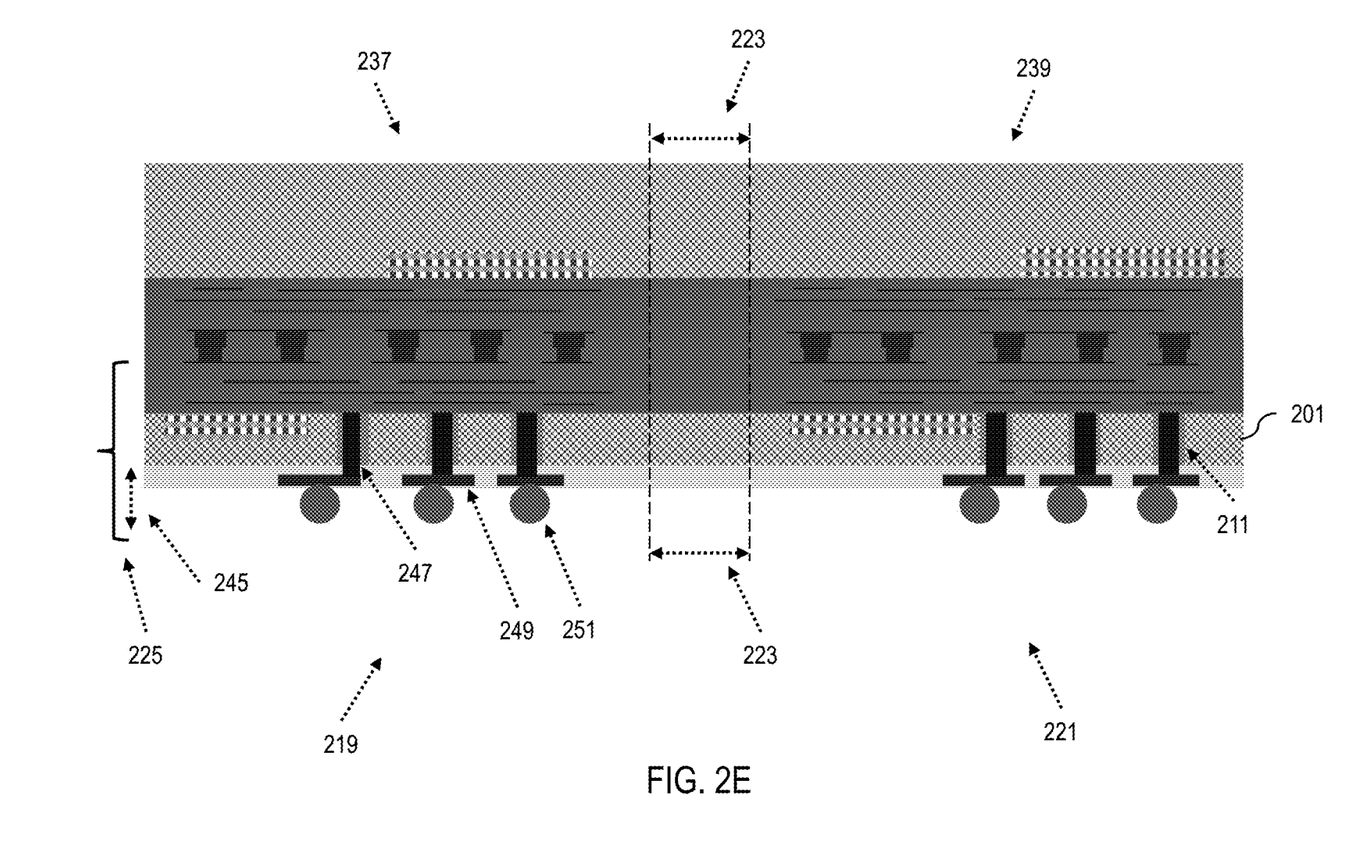
Figure 2F:
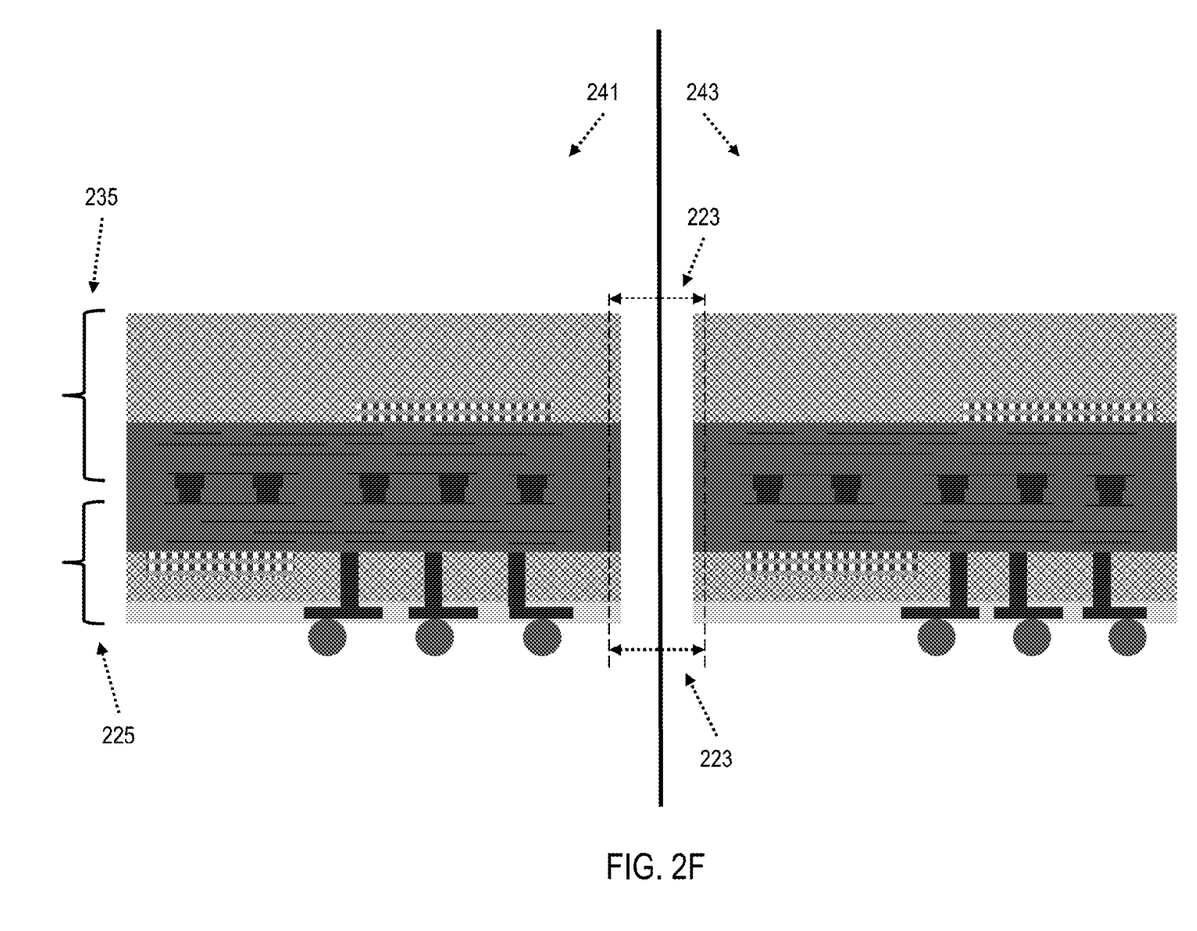
Figure 2G:
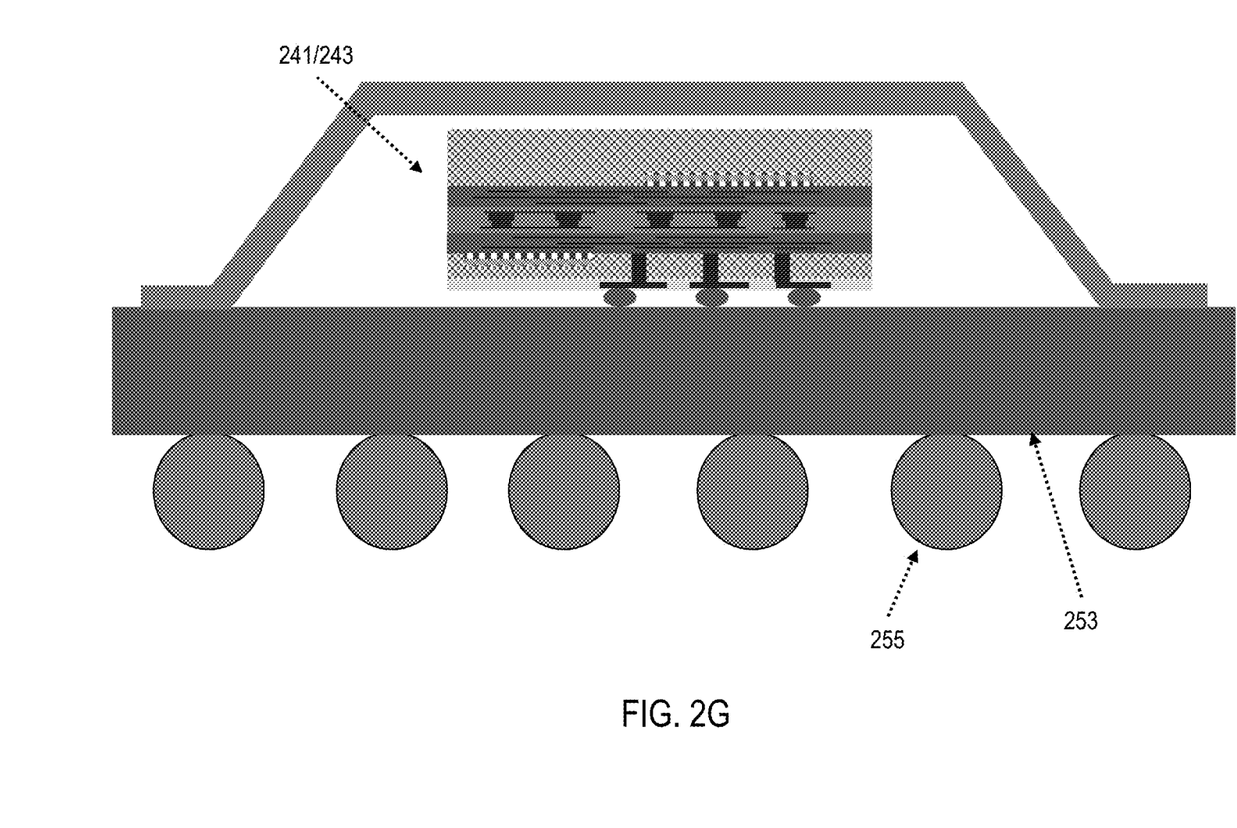
FIG. 2G schematically illustrates an IC chip stack in an example IC packaging.

In FIG. 2E, a vertical portion 245 of the IC substrate 201 in the bottom wafer 225 may be removed to expose a surface 247 of each of TSVs 211. Conductive elements 249 (e.g., metal segments) may be formed between the exposed surfaces 247 of the TSVs 211 and interconnecting elements 251 (e.g., solder bumps, for example of tin-silver (SnAg)) for connecting to an IC package substrate (as will be discussed in FIG. 2G). Adverting to FIG. 2F, a laser beam, a mechanical dicing device or other dicing processes may be utilized to separate the 3D SoC devices 241 and 243 through the vertically aligned dicing lanes 223 in the top and bottom wafers 235 and 225. FIG. 2G illustrates a flip-chip IC package including a 3D SoC device 241 or 243 connected to a package substrate 253, which may be connected to a PCB of an electronic device through interconnecting elements 255.

The embodiments of the present disclosure can achieve several technical effects including integrating TSVs in an IC chip during MOL processes, subsequent to forming a device layer in the IC chip, using an existing toolset and infrastructure and without requiring sophisticated alignment, design and process techniques. Also, the TSVs' structures and quality in a 3D SoC device using a TSV-middle approach may be superior to a TSV-last approach, where etching of a TSV-last from a backside of a Si wafer may be difficult. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use static-random-access memory (SRAM) cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a device layer in each of integrated circuit (IC) chips on upper surfaces of top and bottom silicon (Si) wafers;
   forming, subsequent to the device layer, through-silicon vias (TSVs) extending through an upper surface of the device layer in each of the IC chips and into the bottom Si wafer;
   forming, subsequent to the TSVs, a dielectric layer on the upper surface of the device layer in each of the IC chips of the top and bottom Si wafers;
   forming a back-end-of-line (BEOL) metal layer in the dielectric layer of each of the IC chips of the top and bottom Si wafers;
   face-to-face bonding of opposing IC chips of the top and bottom Si wafers;
   dicing adjacent bonded IC chips through vertically aligned dicing lanes in the top and bottom Si wafers;
   planarizing the upper surface of the dielectric layer to a level of a BEOL final metal layer in each of the IC chips of the top and bottom Si wafers; and
   forming vias in the dielectric layer of each of the IC chips of the top and bottom Si wafers, wherein upper surfaces of the vias are coplanar with the BEOL final metal layer in each of the IC chips of the top and bottom Si wafers,
   wherein the face-to-face bonding of the opposing IC chips comprises:
   hybrid-oxide bonding of vertically aligned exposed upper surfaces of the vias in the opposing IC chips.

2. The method according to claim 1, wherein forming a TSV comprises:
   forming a cavity extending through the upper surface of the device layer in each of the IC chips and into the bottom Si wafer;
   forming a TSV dielectric layer on vertical and horizontal surfaces of the cavity; and
   depositing in the cavity a conductive material surrounded by the TSV dielectric layer, wherein an upper surface of the TSV is exposed.

3. The method according to claim 1, further comprising:
   forming conductive elements between the BEOL metal layer and the device layer in each of the IC chips of the top and bottom Si wafers.

4. The method according to claim 1, wherein the upper surfaces of the vias in the IC chips of the bottom Si wafer are either larger or smaller than the upper surfaces of the vias in the IC chips of the top Si wafer.

5. The method according to claim 1, further comprising:
   forming the BEOL metal layer and the vias in each of the IC chips of the top and bottom Si wafers by a dual damascene process.

6. The method according to claim 1, further comprising:
   prior to the dicing, removing, in each of the IC chips, a vertical portion of the bottom Si wafer to expose a section of each of the TSVs; and
   forming conductive elements between an exposed section of each of the TSVs and interconnecting elements of an IC package substrate.

7. The method according to claim 1, comprising hybrid-oxide bonding at a low-k dielectric layer in the opposing IC chips.

8. The method according to claim 1, comprising forming the TSVs after forming contacts for the device layer and before forming first via contacts to BEOL metal layer in the IC chips of the bottom Si wafer.

9. The method according to claim 1, wherein sizes of the TSVs are based on an aspect ratio of 1 to 20.

* * * * *